(12) United States Patent
Maharyta et al.

(10) Patent No.: US 8,154,310 B1
(45) Date of Patent: Apr. 10, 2012

(54) CAPACITANCE SENSOR WITH SENSOR CAPACITANCE COMPENSATION

(75) Inventors: Andriy Maharyta, Lviv (UA); Andriy Ryshtun, Drogobych (UA)

(73) Assignee: Cypress Semiconductor Corporation, San Jose, CA (US)

( * ) Notice: Subject to any disclaimer, the term of this patent is extended or adjusted under 35 U.S.C. 154(b) by 401 days.

(21) Appl. No.: 12/395,546

(22) Filed: Feb. 27, 2009

Related U.S. Application Data

(60) Provisional application No. 61/067,540, filed on Feb. 27, 2008.

(51) Int. Cl.
G01R 27/26 (2006.01)
G01R 27/02 (2006.01)
(52) U.S. Cl. ......... 324/686; 324/678; 324/684; 327/517
(58) Field of Classification Search ........... 324/658–688
See application file for complete search history.

(56) References Cited

U.S. PATENT DOCUMENTS

| | | | | |
|---|---|---|---|---|
| 5,576,628 | A * | 11/1996 | Caliboso et al. | 324/678 |
| 7,129,714 | B2 * | 10/2006 | Baxter | 324/678 |
| 7,253,643 | B1 * | 8/2007 | Seguine | 324/686 |
| 7,307,485 | B1 * | 12/2007 | Snyder et al. | 331/150 |
| 7,504,833 | B1 * | 3/2009 | Seguine | 324/672 |
| 2004/0247163 | A1 * | 12/2004 | Hara | 382/124 |
| 2008/0036473 | A1 * | 2/2008 | Jansson | 324/678 |
| 2008/0312857 | A1 | 12/2008 | Sequine | |
| 2009/0108914 | A1 * | 4/2009 | Zhang et al. | 327/517 |
| 2009/0174417 | A1 * | 7/2009 | Remmers et al. | 324/686 |

OTHER PUBLICATIONS

"PSoC® Mixed-Signal Array, Final Data Sheet, CY8C20234, CY8C20334,and CY8C20434," Cypress Semiconductor Corp. 2005-2006, Document No. 001-05356 Rev. B, Sep. 18, 2006, pp. 1-32.
Dave Van Ess, "Understanding Switched Capacitor Analog Blocks", Cypress Microsystems, Application Note AN2041 Rev. B, Mar. 30, 2004, pp. 1-16.
Mark Lee, "Capacitance Sensing—CapSense Best Practices", Cypress Perform, Application Note AN2394, Document No. 001-41450, Jan. 4, 2007, pp. 1-11.
Robert Jania, "Cypress' CapSense Successive Approximation Algorithm", Cypress Perform, White Paper, CSA RJO.doc, Jan. 17, 2007, pp. 1-6.

* cited by examiner

*Primary Examiner* — Jermele M Hollington
*Assistant Examiner* — Emily Chan

(57) ABSTRACT

A capacitance sensing circuit may include a capacitive sensor configured to conduct a sensor current, a current source for supplying a compensation current to the capacitive sensor, and a current mirror that generates a mirror current based on a compensated sensor current, where the compensated sensor current represents a difference between the compensation current and the sensor current. A measurement circuit generates an output signal corresponding to the capacitance of the capacitive sensor.

14 Claims, 9 Drawing Sheets

CAPACITANCE SENSOR WITH SENSOR CAPACITANCE COMPENSATION

CROSS-REFERENCE TO RELATED APPLICATIONS

This application claims the benefit of U.S. Provisional Patent Application No. 61/067,540, filed Feb. 27, 2008.

TECHNICAL FIELD

This disclosure relates to the field of user interface devices and, in particular, to capacitive sensor devices.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of a conductive object, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

One type of touchpad operates by way of capacitance sensing utilizing capacitance sensors. The capacitance, detected by a capacitance sensor, changes as a function of the proximity of a conductive object to the sensor. The conductive object can be, for example, a stylus or a user's finger. In a touch-sensor device, a change in capacitance detected by each sensor in the X and Y dimensions of the sensor array due to the proximity or movement of a conductive object can be measured by a variety of methods. Regardless of the method, usually an electrical signal representative of the capacitance detected by each capacitive sensor is processed by a processing device, which in turn produces electrical or optical signals representative of the position of the conductive object in relation to the touch-sensor pad in the X and Y dimensions. A touch-sensor strip, slider, or button operates on the same capacitance-sensing principle.

A first type of conventional touchpad is composed of a matrix of rows and columns. Within each row or column, there are multiple sensor elements. However, all sensor pads within each row or column are coupled together and operate as one long sensor element. A second type of conventional touchpad is composed of an XY array of independent sense elements, where each sensor element in a row or column is separately sensed. Here, each row and column is composed of multiple sensing elements, each capable of independent detection of a capacitive presence and magnitude. These may then be used to detect any number of substantially simultaneous touches.

The capacitive sensing systems used in interface devices such as touchpads generally operate by detecting changes in the capacitances of the capacitive sensors resulting from proximity or contact of an object with the sensor, however the ability to resolve changes in capacitance may be impaired if the changes in capacitance to be detected by the sensor are small relative to the capacitance of the sensor. For instance, a capacitive sensor element that is configured to detect an input, such as proximity or contact with a finger or other object, may have a capacitance $C_P$ between the sensor element and ground when no input is present. The capacitance $C_P$ is known as the parasitic capacitance of the sensor. For capacitive sensors having multiple sense elements, a mutual capacitance $C_M$ may also be present between two or more sense elements. An input detected by the sensor may cause a change in capacitance $C_F$ that is much smaller than $C_P$ or $C_M$. Accordingly, where the sensor capacitance is represented as a digital code, the parasitic or mutual capacitances may be represented by a larger proportion of the discrete capacitance levels resolvable by the digital code, while the capacitance change $C_F$ is represented by fewer of these discrete levels. In such cases, the capacitance change $C_F$ due to an input may not be resolvable to a high degree of resolution.

Additionally, the design of some capacitive sensors also results in a high susceptibility to noise due to electromagnetic interference (EMI). For example, a capacitive touchpad or slider device may include an array of capacitive sensor elements, each of which may include a conductive trace having a substantial length. Such conductive traces may couple noise into a capacitance measurement circuit and reduce the ability of the measurement circuit to measure capacitance levels accurately and precisely.

BRIEF DESCRIPTION OF THE DRAWINGS

The present disclosure is illustrated by way of example, and not by way of limitation, in the figures of the accompanying drawings.

DETAILED DESCRIPTION

Figure 1:
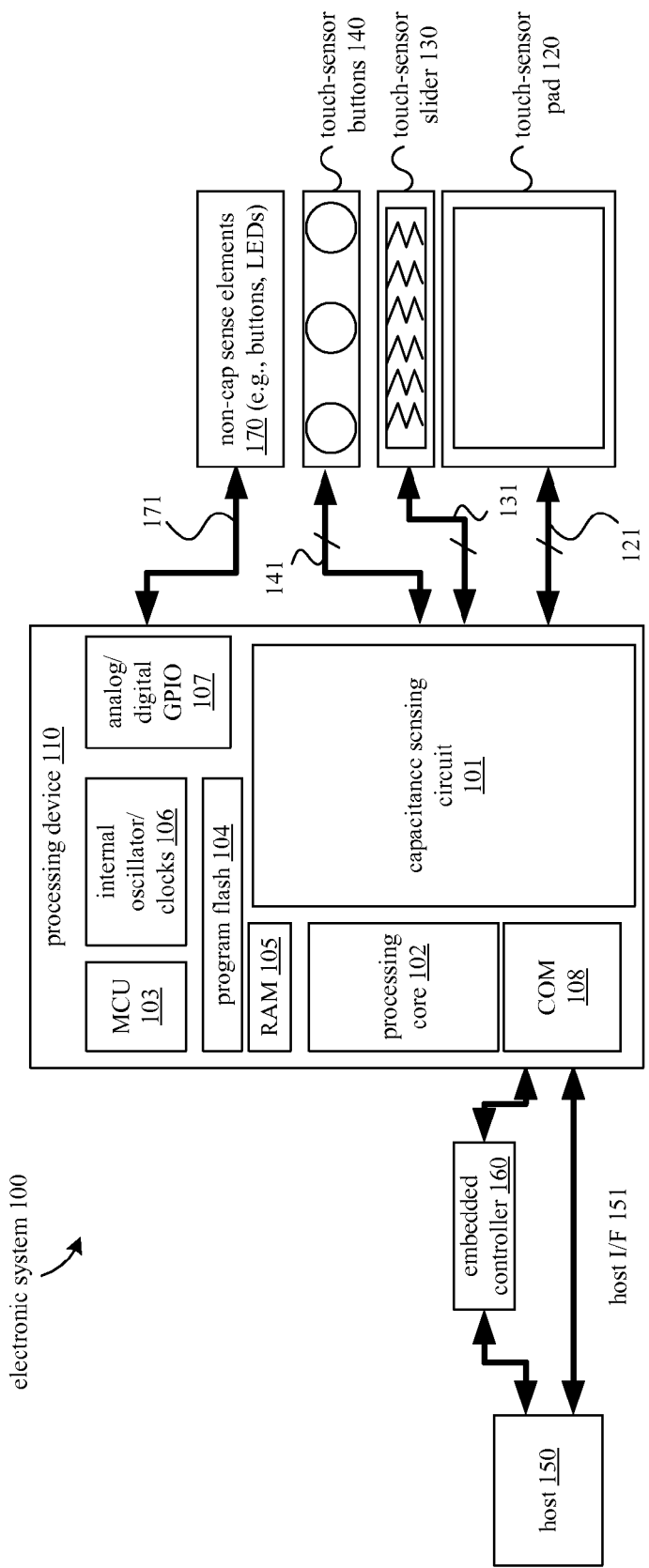
FIG. 1 illustrates a block diagram of one embodiment of an electronic system in which a capacitance sensor is used.

Described herein are embodiments of a method and apparatus for measuring a capacitance of a capacitive sensor while compensating for a baseline capacitance of the sensor and maintaining a low input impedance for increasing noise immunity. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus for measuring capacitance of a capacitive sensor are described. In one embodiment, a capacitance sensing circuit detects an input at the capacitive sensor by detecting a change in the capacitance of a sensor element. For example, a finger placed near the capacitive sensor may cause an increase $C_F$ in the capacitance of the sensor. The magnitude of $C_F$ may be detected and converted to a voltage level or a digital code (by a capacitance-to-code conversion circuit) that can be processed by a computer or other circuit.

One embodiment of a capacitive sensor includes a positive electrode connected to a voltage source and a negative electrode connected to ground. The capacitance of such a capacitive sensor can be measured by repeatedly charging the positive electrode of the sensor from a voltage source and discharging the positive electrode to ground, causing a sensor current to flow between the voltage source and ground. Since the flow of the sensor current depends on the capacitance of the sensor, the sensor current can be measured to determine the capacitance of the sensor.

A portion of the sensor current may be attributable to a baseline capacitance $C_B$, which represents a total capacitance of the capacitive sensor when no input (i.e., a finger touch) is present. The baseline capacitance may include the mutual capacitance $C_M$ between the positive and the negative electrodes, and/or the parasitic capacitance $C_P$ between each of the electrodes and other conductors (e.g., printed circuit board (PCB) traces or electrodes of other capacitive sensors).

The ability of a digital code to resolve many levels of $C_F$ (which represents a change in capacitance of the capacitive sensor resulting from an input such as a finger touch) may be degraded if the baseline capacitance $C_B$ is large in comparison to $C_F$. Therefore, the dynamic range of a capacitance-to-code conversion circuit may not be used effectively, since $C_F$ is measured in the presence of the large base value of $C_B$. Thus, in one embodiment, the effects of the baseline capacitance $C_B$ are compensated using a current source to cancel the portion of the sensor current attributable to the baseline capacitance. This allows the digital code to resolve $C_F$ using a greater number of discrete levels, increasing the dynamic range utilization of the capacitance sensing circuit.

In one embodiment, a current mirror generates a mirror current based on the sensor current. A measurement circuit measures the mirror current rather than measuring the sensor current directly. The presence of the current mirror decreases the input impedance seen by the capacitive sensor. The decreased input impedance increases immunity of the measurement circuit to low frequency noise that is coupled to the system through the capacitive sensor or other conductors, such as PCB traces. Additionally, the current mirror isolates the measurement circuit from the voltage supply used to charge the capacitive sensor so that the voltage supply is not limited by the input requirements of the measurement circuit.

FIG. 1 illustrates a block diagram of one embodiment of an electronic system in which a capacitance sensor with baseline capacitance compensation circuit and current mirror can be implemented. Electronic system 100 includes processing device 110, touch-sensor pad 120, touch-sensor slider 130, touch-sensor buttons 140, host processor 150, embedded controller 160, and non-capacitance sensor elements 170. The processing device 110 may include analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not illustrated). The digital block array may be configured to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory (RAM) 105 and program flash 104. RAM 105 may be static RAM (SRAM), and program flash 104 may be a non-volatile storage, which may be used to store firmware (e.g., control algorithms executable by processing core 102 to implement operations described herein). Processing device 110 may also include a memory controller unit (MCU) 103 coupled to memory and the processing core 102.

The processing device 110 may also include an analog block array (not illustrated). The analog block array is also coupled to the system bus. Analog block array also may be configured to implement a variety of analog circuits (e.g., ADCs or analog filters) using, in one embodiment, configurable UMs. The analog block array may also be coupled to the GPIO 107.

As illustrated, capacitance sensing circuit 101 may be integrated into processing device 110. Capacitance sensing circuit 101 may include analog I/O for coupling to an external component, such as touch-sensor pad 120, touch-sensor slider 130, touch-sensor buttons 140, and/or other devices. Capacitance sensing circuit 101 and processing device 102 are described in more detail below.

The embodiments described herein are not limited to touch-sensor pads for notebook implementations, but can be used in other capacitive sensing implementations, for example, the sensing device may be a touch screen, a touch-sensor slider 130, or touch-sensor buttons 140 (e.g., capacitance sensing buttons). In one embodiment, these sensing devices may include one or more capacitive sensors. It should also be noted that the embodiments described herein may be implemented in other sensing technologies than capacitive sensing, such as resistive, optical imaging, surface wave, infrared, dispersive signal, and strain gauge technologies. Similarly, the operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 100 includes a touch-sensor pad 120 coupled to the processing device 110 via bus 121. Touch-sensor pad 120 may include a multi-dimension sensor array. The multi-dimension sensor array includes multiple sensor elements, organized as rows and columns. In another embodiment, the electronic system 100 includes a touch-sensor slider 130 coupled to the processing device 110 via bus 131. Touch-sensor slider 130 may include a single-dimension sensor array. The single-dimension sensor array includes multiple sensor elements, organized as rows, or alternatively, as columns. In another embodiment, the electronic system 100 includes touch-sensor buttons 140 coupled to the processing device 110 via bus 141. Touch-sensor buttons 140 may include a single-dimension or multi-dimension sensor array. The single- or multi-dimension sensor array may include multiple sensor elements. For a touch-sensor button, the sensor elements may be coupled together to detect a presence of a conductive object over the entire surface of the sensing device. Alternatively, the touch-sensor buttons 140 may have a single sensor element to detect the presence of the conductive object. In one embodiment, touch-sensor buttons 140 may include a capacitive sensor element. Capacitive sensor elements may be used as non-contact sensor elements. These sensor elements, when protected by an insulating layer, offer resistance to severe environments.

The electronic system 100 may include any combination of one or more of the touch-sensor pad 120, touch-sensor slider 130, and/or touch-sensor button 140. In another embodiment, the electronic system 100 may also include non-capacitance sensor elements 170 coupled to the processing device 110 via bus 171. The non-capacitance sensor elements 170 may include buttons, light emitting diodes (LEDs), and other user interface devices, such as a mouse, a keyboard, or other functional keys that do not require capacitance sensing. In one embodiment, buses 171, 141, 131, and 121 may be a single bus. Alternatively, these buses may be configured into any combination of one or more separate buses.

Processing device 110 may include internal oscillator/clocks 106 and communication block 108. The oscillator/clocks block 106 provides clock signals to one or more of the components of processing device 110. Communication block 108 may be used to communicate with an external component, such as a host processor 150, via host interface (I/F) line 151. Alternatively, processing block 110 may also be coupled to embedded controller 160 to communicate with the external components, such as host 150. In one embodiment, the processing device 110 is configured to communicate with the embedded controller 160 or the host 150 to send and/or receive data.

Processing device 110 may reside on a common carrier substrate such as, for example, an integrated circuit (IC) die substrate, a multi-chip module substrate, or the like. Alternatively, the components of processing device 110 may be one or more separate integrated circuits and/or discrete components. In one exemplary embodiment, processing device 110 may be a Programmable System on a Chip (PSoC™) processing device, manufactured by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 110 may also be done in the host.

Capacitance sensing circuit 101 may be integrated into the IC of the processing device 110, or alternatively, in a separate IC. Alternatively, descriptions of capacitance sensing circuit 101 may be generated and compiled for incorporation into other integrated circuits. For example, behavioral level code describing capacitance sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensing circuit 101.

It should be noted that the components of electronic system 100 may include all the components described above. Alternatively, electronic system 100 may include only some of the components described above.

In one embodiment, electronic system 100 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

Figure 2:
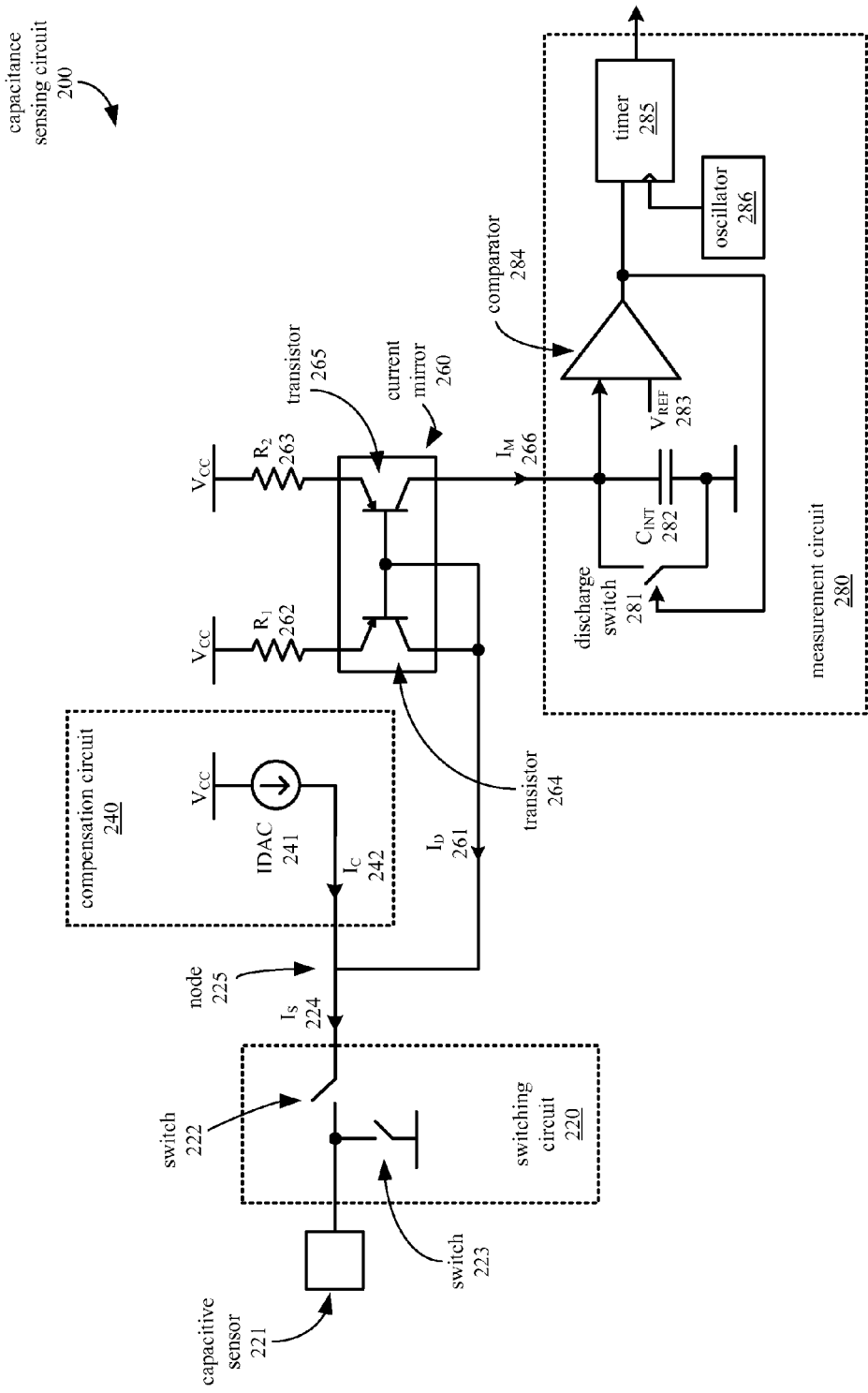
FIG. 2 is a circuit diagram illustrating a circuit for measuring capacitance of a capacitive sensor, according to one embodiment.

FIG. 2 is a circuit diagram illustrating a circuit for measuring capacitance of a capacitive sensor, according to one embodiment. Capacitance sensing circuit 200 may be included in an electronic system, such as electronic system 100.

Capacitive sensing circuit 200 includes capacitive sensor 221, switching circuit 220, compensation circuit 240, current mirror 260, and measurement circuit 280. Switching circuit 220 includes switches 223 and 222, through which sensor current $I_S$ 224 flows. Compensation circuit 240 includes current digital-to-analog converter (IDAC) 241 that outputs a compensation current $I_C$ 242 that flows into node 225. Current mirror 260 includes transistors 264 and 265, which are connected through resistors $R_1$ 262 and $R_2$ 263, respectively, to supply voltage $V_{CC}$. Compensated sensor current $I_D$ 261 flows out of transistor 264 and mirror current $I_M$ flows out of transistor 265. Measurement circuit 280 includes an integration capacitor $C_{INT}$ connected to an input of a comparator 284, a timer 285 connected to the output of the comparator 284, and an oscillator 286 connected to the timer 285. The output of comparator 284 is also connected to a discharge switch 281 that discharges $C_{INT}$ 282.

In one embodiment, the capacitive sensor 221 is a sensor having a capacitance that is affected by the proximity of a conductive object, such as a finger. The capacitive sensor 221 is repeatedly charged and discharged by switching circuit 220. In one embodiment, switches 222 and 223 are operated in a non-overlapping manner (so that both switches are not simultaneously closed) to charge and discharge capacitive sensor 221. For example, switch 222 connects sensor 221 to a positive voltage supply $V_{CC}$, charging sensor 221. Switch 222 opens and switch 223 closes, discharging sensor 221 to ground. The repeated charging and discharging of the sensor 221 results in the flow of sensor current $I_S$ 224 from node 225 to ground. Thus, the combination of capacitive sensor 221 and switching circuit 220 can be represented as an equivalent resistance $R_S$ that conducts sensor current $I_S$ 224 between node 225 and ground.

Compensation circuit 240 compensates for a baseline capacitance $C_B$ of the capacitive sensor 221 by supplying a compensation current $I_C$ 242 to the capacitive sensor 221. Specifically, the compensation current supplies $I_C$ 242 into node 225 connected to the sensor 221 through switch 222. In one embodiment, $I_C$ 242 is approximately equal to the amount of current attributable to the baseline capacitance of sensor 221. For example, $I_C$ 242 may be chosen so that the net current flowing into node 225 is zero when no input is present at capacitive sensor 221. In one embodiment, $I_C$ 242 is supplied from a current digital-to-analog converter (IDAC) 241, which is programmed to output a desired compensation current $I_C$ 242.

In addition to the switching circuit 220 and the compensation circuit 240, node 225 is also connected to current mirror 260. Compensated sensor current $I_D$ 261, which is the difference between $I_C$ 242 and $I_S$ 224, flows from transistor 264 of current mirror 260 into node 225. The magnitude of $I_D$ 261 indicates the magnitude of a change in capacitance $C_F$ at capacitive sensor 221. For example, when no input is present at capacitive sensor 221, $I_S$ 224 is equal to $I_C$ 242 so that $I_D$ 261 is zero. When the capacitance at capacitive sensor 221 is increased by an input at capacitive sensor 221, the amount of charge stored in sensor 221 and then discharged to ground increases with the capacitance. Thus, the sensor current $I_S$ 224 and the compensated sensor current $I_D$ 261 also increase.

The compensated sensor current $I_D$ 261 flows out of the transistor 264 and is mirrored by transistor 265 to generate a mirror current $I_M$ 266. In one embodiment, $I_M$ 266 is approximately equal to $I_D$. In alternative embodiments, the current mirror 260 amplifies $I_D$ so that $I_M$ is proportionally greater or less than $I_D$ by a desired amplification factor. For example, a high voltage may be used to charge sensor 221, resulting in a large value of $I_D$ 261 that is outside the operating range of measurement circuit 280. The current mirror 260 can generate a reduced mirror current $I_M$ 266, corresponding to $I_D$ 261, that is within the operating range of the measurement circuit 280.

The measurement circuit 280 receives the mirror current $I_M$ 266 as an input. $I_M$ 266 is used to charge integration capacitor $C_{INT}$ 282 so that the voltage at $C_{INT}$ increases over time. The voltage of $C_{INT}$ is applied to an input of comparator 284. Comparator 284 compares the voltage of $C_{INT}$ with a reference voltage $V_{REF}$ 283. When the $C_{INT}$ voltage exceeds $V_{REF}$ 283, the comparator outputs a signal to timer 285. The output of comparator 284 is also connected to discharge switch 281 so that discharge switch 281 discharges $C_{INT}$ when the voltage of $C_{INT}$ exceeds $V_{REF}$ 283, preparing $C_{INT}$ for the next charge cycle.

Comparator 284 thus outputs a series of pulses as the voltage of $C_{INT}$ exceeds $V_{REF}$ 283 and subsequently drops below $V_{REF}$ 283 as $C_{INT}$ is discharged. Timer 285 detects the time between these pulses and outputs a count value that corresponds to the capacitance of sensor 221. For example, the duration between pulses output by the comparator 284 decreases with an increase in the mirror current $I_M$ 266 because a higher $I_M$ charges $C_{INT}$ more quickly. In one embodiment, timer 285 counts the number of oscillations from oscillator 286 between pulses from the comparator 284.

Figure 3A:
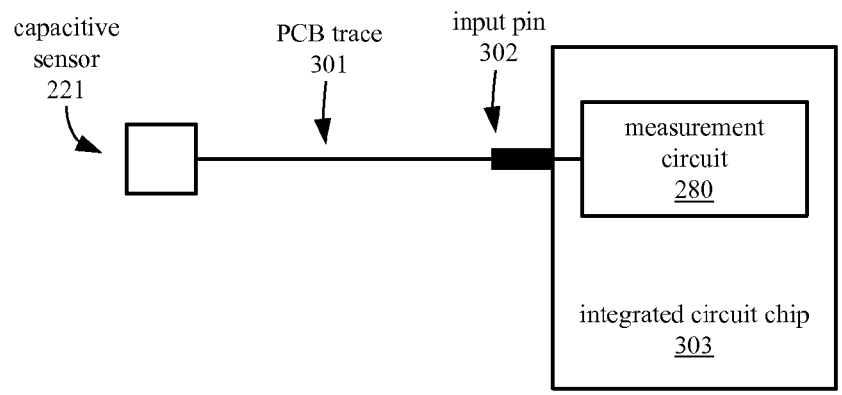
FIG. 3A is a block diagram illustrating a connection between a capacitive sensor and an integrated circuit chip, according to one embodiment.

FIG. 3A is a block diagram illustrating a connection between a capacitive sensor 221 and an integrated circuit chip 303, according to one embodiment. Capacitive sensor 221 is connected to input pin 302 of integrated circuit chip 303 through a printed circuit board (PCB) trace 301. Within the integrated circuit chip 303, input pin 302 is connected to a measurement circuit 280.

In one embodiment, the capacitive sensor 221 and PCB trace 301 are unshielded conductors and are susceptible to electromagnetic interference (EMI). Noise caused by EMI may be coupled into the measurement circuit 280 through input pin 302, where it may cause error in the measurement of capacitive sensor 221.

Figure 3B:
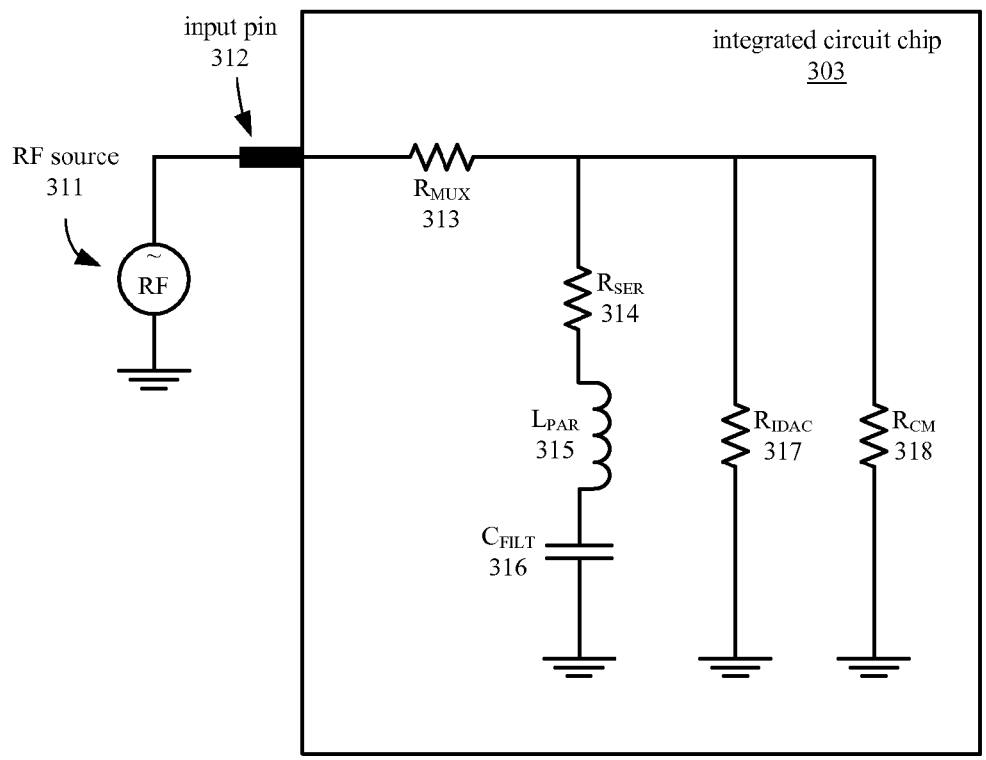
FIG. 3B is a circuit diagram illustrating equivalent impedances of a capacitance measurement circuit in an integrated circuit chip, according to one embodiment.

FIG. 3B is a circuit diagram illustrating equivalent impedances of a capacitance measurement circuit in an integrated circuit chip, according to one embodiment. In one embodiment, EMI immunity is inversely proportional to the input impedance of the measurement circuit 280. This input impedance can be modeled as a filter capacitance $C_{FILT}$ 316 that reduces the effect of radio frequency (RF) noise coupling at high frequencies. In addition, the input impedance includes an inductive component, modeled as a parasitic inductor $L_{PAR}$ 315, and a series resistance $R_{SER}$ 314. $L_{PAR}$ 315 and $R_{SER}$ 314 reduce the noise suppression effect of $C_{FILT}$ 316 at high frequencies. In one embodiment, a smaller value of $C_{FILT}$ 316 may be used to maintain a high sensor scanning speed, so that $C_{FILT}$ 316 may not provide reliable high frequency noise suppression.

The IDAC, such as IDAC 241, can be modeled as a resistance $R_{IDAC}$ 317. $R_{IDAC}$ 317 provides an additional low impedance to ground, parallel to $C_{FILT}$ 316, $L_{PAR}$ 315, and $R_{SER}$ 314. The series resistance $R_{MUX}$ 313 represents the impedance of an analog multiplexer bus (which will be described later with reference to FIG. 5) through which the capacitive sensor 221 is connected to the measurement circuit 280.

A measurement circuit 280 that includes a current mirror, such as current mirror 260, also has a resistance $R_{CM}$ 318 to model the impedance of the current mirror. $R_{CM}$ 318 provides an impedance between the input pin 312 and ground, and thus decreases the total input impedance of the measurement circuit 280.

For example, if the resistance of $R_{MUX}$ 313 resistance is about 400Ω, the impedance of $C_{FILT}$ 316 at 1 MHz is about 1.6 kΩ, and the IDAC impedance $R_{IDAC}$ 317 is about 100 kΩ, then the input impedance of the measurement circuit 280 without $R_{CM}$ is about 1.6 kΩ at 1 MHz.

When $R_{CM}$ is included, the input impedance of the measurement circuit 280 decreases. For example, a typical value for $R_{CM}$ may be 300-400Ω. In this case input impedance of the measurement circuit 280 at 1 MHz is about 700Ω, which is three times lower than in a measurement circuit 280 that does not include $R_{CM}$. Thus, the decreased resistance to ground provided by the current mirror increases immunity to low frequency noise.

Figure 4:
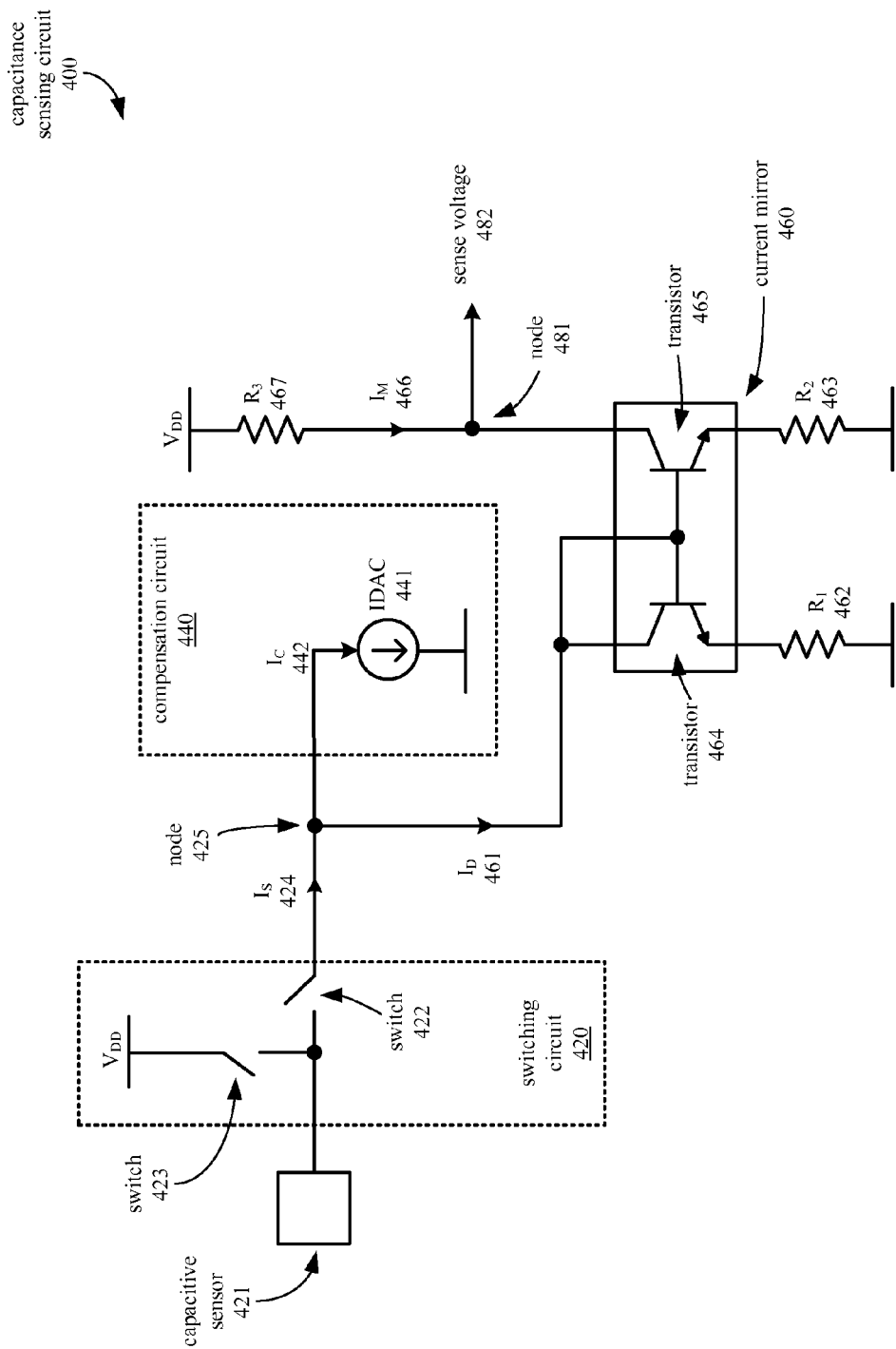
FIG. 4 is a circuit diagram illustrating one embodiment of a capacitance sensing circuit including a current mirror.

FIG. 4 is a circuit diagram illustrating an embodiment of a capacitance sensing circuit including a current mirror. Capacitance sensing circuit 200 may be included in an electronic system, such as electronic system 100.

Capacitive sensing circuit 400 includes capacitive sensor 421, switching circuit 420, and compensation circuit 440, current mirror 460. Switching circuit 220 includes switches 422 and 423, through which sensor current $I_S$ 424 flows from $V_{DD}$ to node 425. Compensation circuit 440 includes current digital-to-analog converter (IDAC) 441 that sinks a compensation current $I_C$ 442 out of node 425. Current mirror 460 includes transistors 464 and 465, which are connected through resistors $R_1$ 462 and $R_2$ 463, respectively, to ground. Transistor 465 is connected to $V_{DD}$ through $R_3$ 467. Compensated sensor current $I_D$ 461 flows through $R_3$ 467 and into node 481. The output of comparator 484 is connected to a discharge switch 481 that discharges $C_{INT}$ 282.

Capacitive sensor 421 and switching circuit 420 operate in similar fashion as capacitive sensor 221 and switching circuit 220 as described with reference to FIG. 2, except that the operation of switching circuit 420 causes a sensor current $I_S$ 424 to flow from a voltage source VDD into node 425. Specifically, switches 422 and 423 operate in a non-overlapping manner to alternately connected capacitive sensor 421 to VDD and then to node 425. Thus, the sensor 421 is charged from VDD and discharged into node 425, resulting in the flow of $I_S$ 424 into node 425. In one embodiment, the sensor current $I_S$ 424 into node 425 increases when a conductive object is placed near capacitive sensor 421.

Compensation circuit 440 includes an IDAC 441 that is connected to node 425. Similar to the IDAC 241 of compensation circuit 220 in FIG. 2, the IDAC 441 can be used to compensate for a baseline capacitance $C_B$ of capacitive sensor 421. IDAC 441 draws a compensation current $I_C$ 442 out of node 425. In one embodiment, $I_C$ 442 is approximately equal to $I_S$ 424 when no input is present at capacitive sensor 421.

The current out of node 425 represents the difference between the sensor current $I_S$ 424 and the compensation current $I_C$ 442. $I_D$ 461 flows to ground through transistor 464 and resistor $R_1$ 462. Current mirror 460 generates a mirror current $I_M$ 466 through transistor 465 based on the current $I_D$ 461 flowing through transistor 464. In one embodiment, $I_M$ 466 is approximately equal to $I_D$ 461. In an alternative embodiment, the current mirror 460 amplifies $I_D$ 461 so that $I_M$ 466 is proportional to $I_D$ 461.

$I_M$ 466 flows through $R_3$ 467 such that the sense voltage 482 at node 481 is $V_{DD} - I_M \times R_3$. Thus, since the mirror current $I_M$ 466 corresponds to the capacitance of capacitive sensor 421, the sense voltage can be measured to determine the capacitance of the sensor 421.

Figure 5:
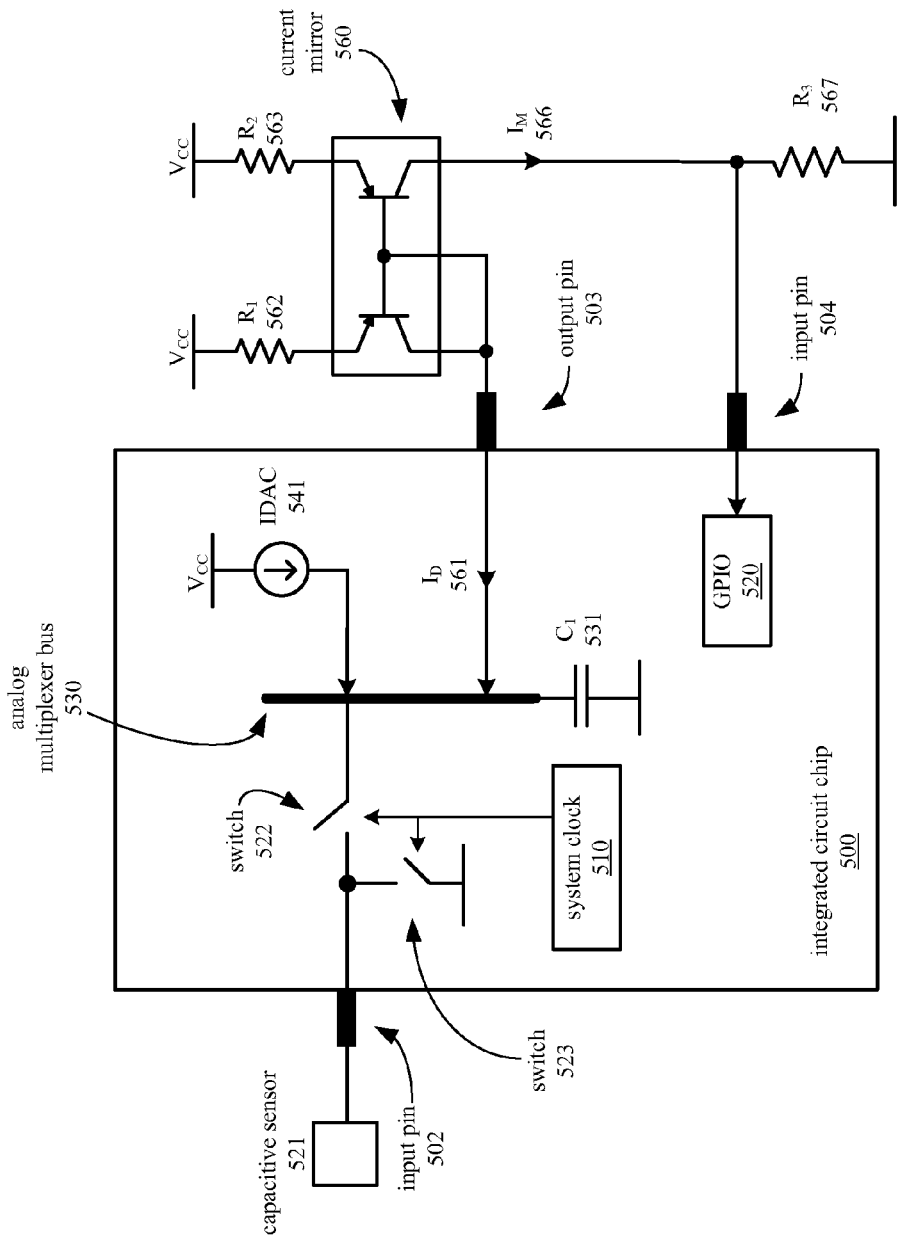
FIG. 5 illustrates one embodiment of a capacitance measurement circuit implemented in an integrated circuit chip.

FIG. 5 illustrates one embodiment of a capacitance measurement circuit implemented in an integrated circuit chip. Integrated circuit chip 500 includes a system clock 510 connected to switches 522 and 523, an analog multiplexer bus 530 with a capacitance $C_1$ 531 to ground, a current digital-to-analog converter (IDAC) 541, and a general purpose input/output (GPIO) port 520. Integrated circuit chip 500 interfaces with external components through input pins 502 and 504, and output pin 503.

Capacitive sensor 521 connects to switches 522 and 523 through input pin 502. Current mirror 560 is connected to analog multiplexor bus through output pin 503. Current mirror 560 is also connected to supply voltage $V_{CC}$ through resistors $R_1$ 562 and $R_2$ 563. A mirror current $I_M$ 566 flows from the current mirror 560 to ground through resistors $R_3$ 567. GPIO port 520 is connected to $R_3$ 567 to monitor the voltage across $R_3$ 567.

The switches 522 and 523 are controlled by the system clock 510 so that they operate in similar fashion as switches 222 and 223 of capacitance sensing circuit 200 illustrated in FIG. 2. Switches 522 and 523 thus charge and discharge the sensor 521 to cause a sensor current $I_S$ to flow into the analog multiplexer bus 530.

IDAC 541 supplies a compensation current to the bus 530 to compensate for a portion of the sensor current $I_S$ that is attributable to the baseline capacitance of the capacitive sensor 521.

The analog multiplexer bus 530 connects components within integrated circuit chip 500, and is also coupled to ground through a capacitance $C_1$ 531. In one embodiment, the bus 530 can be used to selectively connect components within chip 500 to other components within the chip 500.

The current mirror 560 is external to integrated circuit chip 500 and connects to the analog multiplexer bus 530 through output pin 503. A compensated sensor current $I_D$ 561, which represents the difference between the sensor current and the compensation current, flows into the output pin 503 from current mirror 530. Current mirror 530 generates a mirror current $I_M$ 566 based on the compensated sensor current $I_D$ 561. In one embodiment, the current mirror 560 generates a mirror current $I_M$ 566 that is approximately equal to the compensated sensor current $I_D$ 561. In alternative embodiments, the mirror current $I_D$ 566 is proportional to the compensated sensor current $I_D$ 561 according to a predetermined ratio.

$I_M$ 566 flows through $R_3$ 567 to ground such that the voltage across $R_3$ 567 can be expressed as $V_{R3} = I_M \times R_3$. Thus, the GPIO port 520 that is connected to $R_3$ 567 through input pin 504 can be used as a measurement circuit to determine the capacitance of capacitive sensor 521 based on the voltage $V_{R3}$.

In one embodiment, the GPIO port 520 determines whether an input is present at capacitive sensor 521 based on whether $V_{R3}$ exceeds a threshold voltage. For example, GPIO port 520 may assert a signal to indicate an input in response to detecting a value of $V_{R3}$ that exceeds a threshold voltage of 3 volts. In one embodiment, GPIO port 520 is a high impedance input so that the current passing through $R_3$ 567 is approximately equal to $I_M$ 566.

Figure 6:
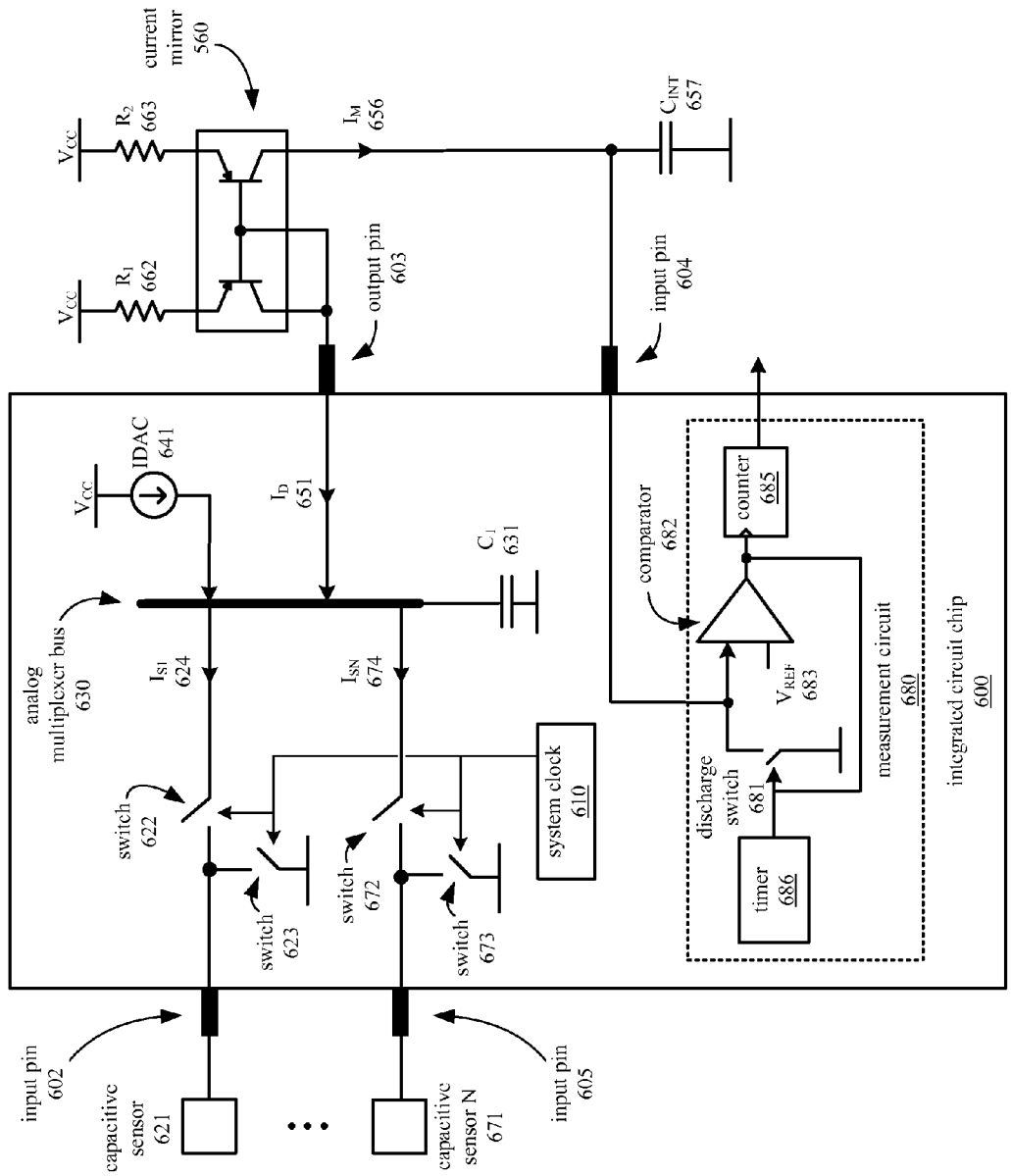
FIG. 6 illustrates one embodiment of a capacitance measuring circuit implemented in an integrated circuit chip.

FIG. 6 illustrates one embodiment of a capacitance measuring circuit implemented in an integrated circuit chip. Integrated circuit chip 600 includes a system clock connected to switches 622, 623, 672, and 673, analog multiplexer bus 630 with a capacitance 631 to ground, current digital-to-analog converter (IDAC) 641, and measurement circuit 680. Measurement circuit 680 includes a discharge switch 681, comparator 682, and counter 685.

A number of capacitive sensors including sensors 621 and 671 are connected to the integrated circuit chip 600 through a set of input pins including input pins 602 and 605. A current mirror 560 is connected to supply voltage $V_{CC}$ through resistors $R_1$ 662 and $R_2$ 663, and is connected to the integrated circuit chip 600 through output pin 603. The current mirror 560 is also connected to the measurement circuit 680 through input pin 604, and is coupled with ground through integration capacitor $C_{INT}$ 657.

Capacitive sensors 621 and 671 are sensors in a set of capacitive sensors connected to the integrated circuit chip 600. In one embodiment, capacitive sensors 621 and 671 are individual capacitive sensors in an array of sensors. For example, a touchpad or slider input device may include a number of capacitive sensing elements, and each of those sensing elements may correspond to a capacitive sensor such as sensor 621 or 671. In one embodiment, the set of capacitive sensors include N sensors, where capacitive sensor 621 represents the first sensor in the set, and sensor 671 represents the Nth sensor in the array. Each of the sensors in the set is connected to the integrated circuit chip 600 through a set of input pins including input pins 602 and 605.

Each of the capacitive sensors in the set of sensors is connected through an input pin to a set of switches, which is in turn connected to the analog multiplexer bus 630. For example, capacitive sensor 621 is connected through input pin 602 to switches 622 and 623. Similarly, sensor 671 is connected through input pin 605 to switches 672 and 673. Switches 622, 623, 672, and 673 are operated in a non-overlapping manner to repeatedly charge and discharge the capacitive sensors 621 and 671. In one embodiment, the switches are controlled by a system clock 610. The operation of switches 622 and 623 results in a sensor current $I_{S1}$ 624 from the analog multiplexer bus 630 to ground. Similarly, the operation of switches 672 and 673 results in a sensor current $I_{SN}$ 476 from the bus 630 to ground.

The analog multiplexer bus carries analog signals and may be used to selectively connect components within the integrated circuit chip 600 with other components in the chip 600. In one embodiment, the bus 630 is used to selectively connect each one of the sensors in the set of capacitive sensors independently to the current mirror 560 and measurement circuit 680. This allows a single measurement circuit 680 to measure capacitances of each of the sensors individually.

For example, where the set of capacitive sensors is a sensor array in a touch slider device, the measurement circuit may measure the capacitances of each of the capacitive sensor elements in the array to determine the location of an input on the slider device. The array of sensors is scanned using the analog multiplexer bus 630 to connect each of the capacitive sensor elements to the measurement circuit 680 in sequence. In alternative embodiments, the analog multiplexer bus 630 may simultaneously connect more than one of the sensors in the set of capacitive sensors to the measurement circuit.

IDAC 641 is used as a compensation circuit, and may be programmed to supply a compensation current to the analog multiplexer bus 630. In one embodiment, the compensation current is approximately equal to a portion of the sensor current $I_{S1}$ 624 or $I_{SN}$ 674 attributable to the baseline capacitances of the sensors 621 and 671, respectively. In one embodiment where the baseline capacitances of the sensors 621 and 671 are different, the IDAC 641 is programmed to supply a different compensation current for each sensor. For example, IDAC 641 may store different compensation current levels in a memory and output an appropriate level to compensate the baseline capacitance of whichever capacitive sensor is connected to the measurement circuit 680 through analog multiplexer bus 630.

The current mirror 560 is connected to analog multiplexer bus 630 through output pin 603. Compensated sensor current $I_D$ 651, which represents the difference between the compensation current from IDAC 641 and the sensor current (i.e., $I_{S1}$ 624 or $I_{SN}$ 674), flows from the current mirror 560 to the bus 630. Current mirror 560 generates a mirror current $I_M$ 656 that is proportional to $I_D$ 651. In one embodiment, $I_M$ 656 is equal to $I_D$ 651. In alternative embodiments, $I_M$ 656 is proportional to $I_D$ 651 according to a predetermined ratio. In such cases, current mirror 560 may be used to increase or decrease the magnitude of $I_D$ 651 to meet the input requirements of measurement circuit 680.

The measurement circuit 680 measures the mirror current $I_M$ 656 generated by the current mirror 560 to determine the capacitance of whichever capacitive sensor is connected through bus 630. The mirror current $I_M$ 656 charges an integration capacitor $C_{INT}$ 657. $C_{INT}$ 657 is connected to an input of comparator 682 so that as the charge on $C_{INT}$ 657 increases, the voltage at the comparator 682 input increases. When the voltage at the input of comparator 682 exceeds a threshold $V_{REF}$ 683, the comparator 682 asserts its output. The comparator 682 output, when asserted, closes the discharge switch 681 to discharge the integration capacitor $C_{INT}$ 657. As $C_{INT}$ 657 is discharged, the voltage at the comparator input drops below $V_{REF}$ 683 and the comparator 682 deasserts its output in response.

Thus, the comparator outputs a series of pulses as $C_{INT}$ 657 is repeatedly charged and discharged. The time between the pulses depends on the magnitude of $I_M$ 656, which in turn depends on the capacitance of whichever capacitive sensor is connected to the bus 630.

In one embodiment, the measurement circuit 680 includes a timer 686 that periodically discharges $C_{INT}$ 657 by closing discharge switch 681. Timer 686 suppresses the output of comparator 682 if the rate of the voltage increase at $C_{INT}$ 657 does not exceed a threshold rate of voltage increase.

In one embodiment, counter 685 outputs a count value indicating the amount of time passing between pulses output by the comparator 682. In an alternative embodiment, the count value indicates a number of pulses output by the comparator 682 within a given time period. The count value can be transmitted to a computer system for further processing.

Figure 7A:
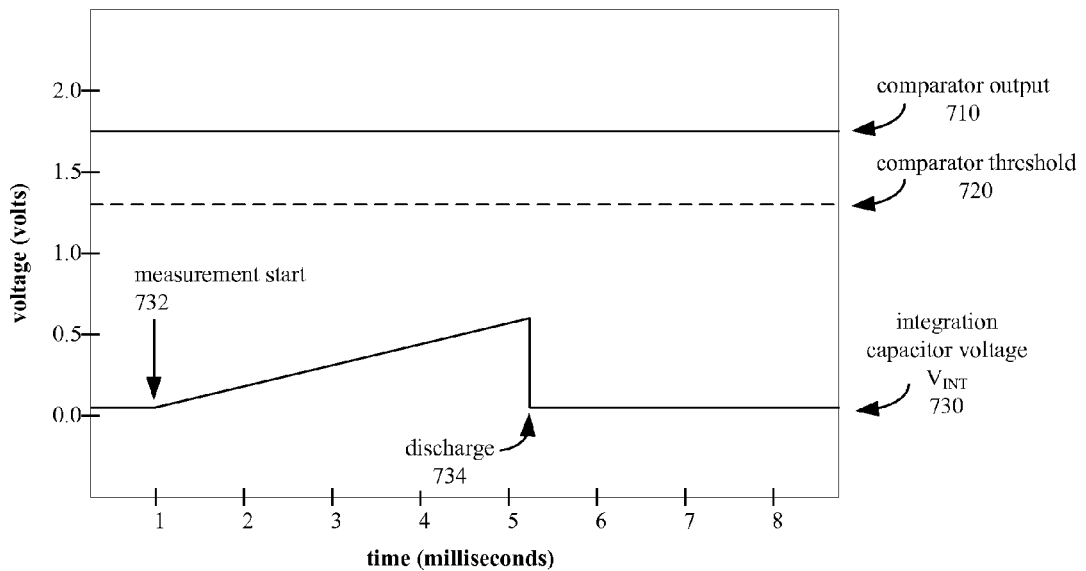
FIG. 7A is a graph illustrating signals associated with the operation of a capacitance sensing circuit, according to one embodiment.

FIG. 7A is a graph illustrating the signals associated with the operation of one embodiment of a capacitance sensing circuit, such as the capacitance sensing circuit described with reference to FIG. 6. The graph of FIG. 7A illustrates signals of the capacitive sensing circuit when no input is present at the capacitive sensor being measured by the capacitance sensing circuit.

The capacitive sensing circuit implemented by integrated circuit chip 600 measures the capacitance of capacitive sensor 621 by connecting the sensor 621 with the current mirror 560 and the measurement circuit 680 using analog multiplexer bus 630. In one embodiment, when no input is present at capacitive sensor 621, the compensation current supplied by IDAC 641 approximately cancels the sensor current $I_{S1}$ 624 so that the compensated sensor current $I_D$ 651 is very small. Accordingly, the mirror current $I_M$ 656 that is generated by the current mirror based on the magnitude of $I_D$ 651 is correspondingly small.

When $I_D$ is used to charge the integration capacitor $C_{INT}$ 657, the rate of the voltage increase across $C_{INT}$ 657 is slow. In one embodiment, the charging of $C_{INT}$ 657 by mirror current $I_M$ 656 begins at measurement start point 732. At measurement start point 732, the integration capacitor voltage $V_{INT}$ 730 across integration capacitor $C_{INT}$ 657 increases over time, as $C_{INT}$ 657 is charged, until $C_{INT}$ 657 is discharged at discharge point 734. In one embodiment, $C_{INT}$ 657 is discharged at periodic intervals by timer 686, as previously described with reference to FIG. 6. Since the charge rate of $C_{INT}$ 657 is slow, $V_{INT}$ 730 does not exceed the comparator threshold 720 before $C_{INT}$ is discharged at point 734. The comparator threshold is set by the reference voltage $V_{REF}$ 683 that is applied to the comparator input.

Since $V_{INT}$ 730 does not exceed comparator threshold 720, the comparator 682 does not output any pulses, and the comparator output 710 remains low, indicating that no input is present at the capacitive sensor 621. In one embodiment, the integration capacitor $C_{INT}$ 657 is discharged periodically even when the comparator threshold 720 is not exceeded.

Figure 7B:
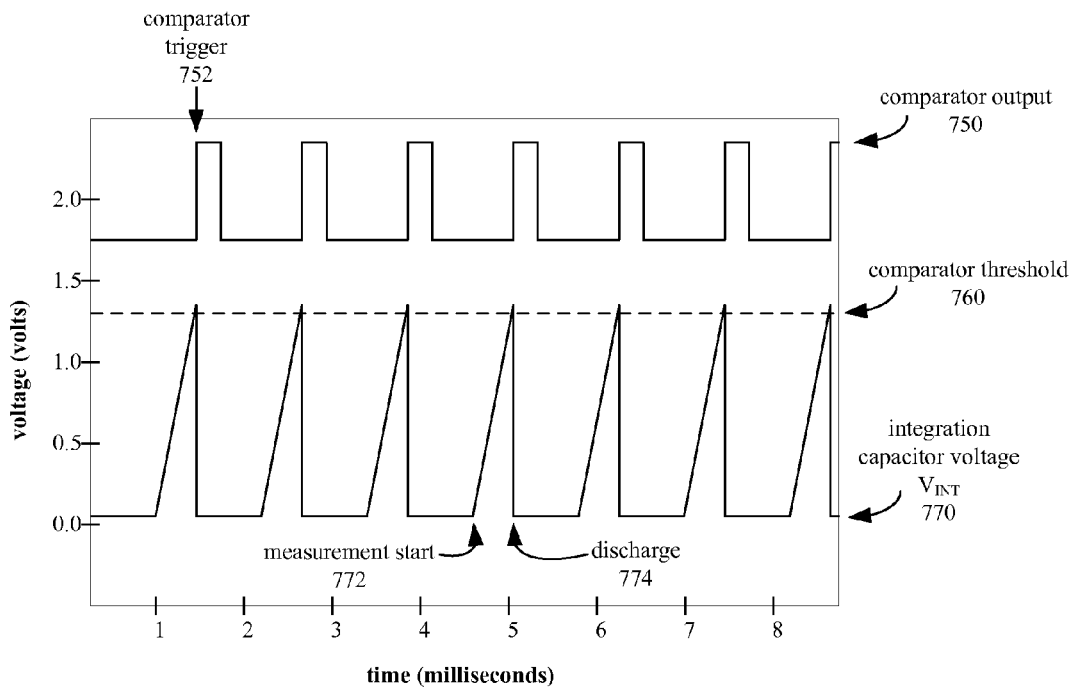
FIG. 7B is a graph illustrating signals associated with the operation of a capacitive sensing circuit, according to one embodiment.

FIG. 7B is a graph illustrating signals of the capacitive sensing circuit when an input is present at the capacitive sensor being measured by the capacitance sensing circuit, according to one embodiment.

When an input is present at the capacitive sensor 621, the capacitance of the sensor 621 increases so that more charge is stored and discharged to ground for each cycle of switches 622 and 623. Accordingly, the sensor current $I_{S1}$ 624 increases, resulting in a corresponding increase in the compensated sensor current $I_D$ 651. $I_M$ 656 is generated by the current mirror 560 based on the magnitude of $I_D$ 651, so that $I_M$ 656 reflects the increase in $I_D$ 651.

When the integration capacitor $C_{INT}$ 657 is charged using $I_M$ 656, the rate of charging is higher than when no input is present at the sensor 621. Accordingly, in contrast with the graph in FIG. 7A, the graph in FIG. 7B illustrates this higher rate of charging over many cycles of charging and discharging the integration capacitor $C_{INT}$ 657. Specifically, the rate of increase of the integration capacitor voltage $V_{INT}$ 770 shows an increase corresponding to the increase in the magnitude of $I_M$ 656.

When an input is present at the sensor 621, the rate of increase of $V_{INT}$ 770 is sufficiently high that $V_{INT}$ 770 exceeds the comparator threshold 760 before being discharged. Each time at which $V_{INT}$ 770 exceeds the comparator threshold 760 corresponds to a comparator trigger point, such as comparator trigger 752, where the comparator asserts its output. At each comparator trigger point, a voltage pulse is generated at the comparator output 750. The discharge 774 occurs when the comparator output 750 causes the discharge switch 681 to discharge the integration capacitor $C_{INT}$ 657.

A counter 685 can count the number of pulses detected within a time frame or measure the time between pulses to determine a capacitance of the capacitive sensor 621.

Figure 8:
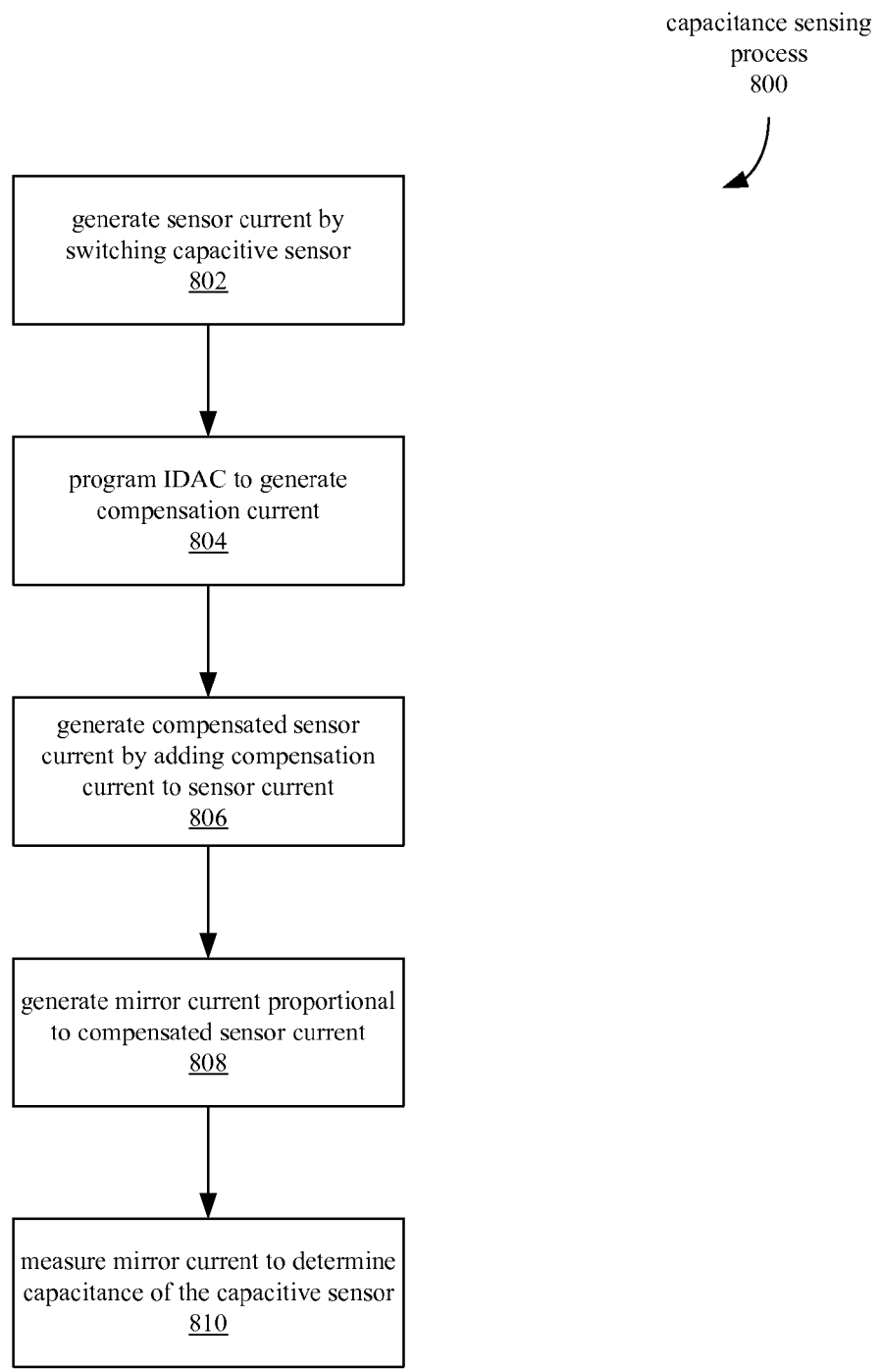
FIG. 8 is a flow diagram illustrating a process for sensing capacitance of a capacitive sensor, according to one embodiment.

FIG. 8 is a flow diagram illustrating a process for sensing capacitance of a capacitive sensor, according to one embodiment. Capacitance sensing process 800 may be implemented, for example, by capacitance sensing circuits 200 and 400 illustrated in FIGS. 2 and 4, respectively.

At block 802, a sensor current $I_S$ is generated by operating a switching circuit connected to the capacitive sensor. For example, in switching circuit 220, switch 222 charges capacitive sensor 221 while switch 223 is open. Switch 222 opens and switch 223 closes to discharge the sensor 221 to ground. In one embodiment, switches 222 and 223 are opened and closed at a frequency determined by an oscillator or a clock signal, and operate in a non-overlapping manner, so that switches 222 and 223 are not simultaneously closed at any point in the switching cycle.

The switching cycle results in a sensor current $I_S$ 224 flowing from node 225 to ground. The magnitude of sensor current $I_S$ 224 depends on the capacitance of sensor 221, which is affected by the proximity of a conductive object near the sensor 221.

At block 804, an IDAC in a compensation circuit is programmed to generate a desired compensation current. In one embodiment, the compensation current cancels a portion of the sensor current attributable to the baseline capacitance of the capacitive sensor 221. For example, $I_C$ 242 may be approximately equal to the portion of $I_S$ 224 that is attributable to the baseline capacitance so that $I_C$ 242 flowing into node 225 added to $I_S$ 224 flowing out of the node 225 results in a net current flow of zero out of node 225 when no input is present at the sensor 221.

In one embodiment, this current setting may be determined during a calibration process. For example, while sensor current $I_S$ 224 is being generated, a compensation current $I_C$ 242 is supplied to node 225 and the current setting for IDAC 241 is adjusted until the compensated sensor current $I_D$ 261, which represents a difference between $I_S$ 224 and $I_C$ 242, is approximately zero.

At block 806, the compensation current is added to the sensor current to generate a compensated sensor current $I_D$. For example, once the IDAC 241 is programmed to provide a specific level of compensation current $I_C$ 242, the IDAC supplies $I_C$ 242 into node 225, from which sensor current $I_S$ 224 is being drawn. The difference between $I_C$ 242 and $I_S$ 224 is the compensated sensor current $I_D$ 261.

When the capacitance of sensor 221 is increased by an input, $I_S$ 224 increases because more charge is stored and discharged to ground by the sensor 221. Since $I_C$ remains constant, $I_D$ 261 increases correspondingly with $I_S$ 224.

At block 808, a current mirror is used to generate a mirror current $I_M$ that is proportional to the compensated sensor current $I_D$. For example, in capacitance sensing circuit 200, the compensated sensor current $I_D$ 261 flows into node 225 from transistor 264. Current mirror 260 generates a mirror current $I_M$ 266 based on the compensated sensor current $I_D$ 261. In one embodiment, $I_M$ 266 is approximately equal to $I_D$ 261. Alternatively, $I_M$ 266 may be greater or smaller in magnitude than $I_D$ 261 according to a desired proportion. For example, this proportion may be chosen to meet input requirements of measurement circuit 280.

At block 810, a measurement circuit measures the mirror current $I_M$ to determine the capacitance of the capacitive sensor. In one embodiment, a measurement circuit can determine the capacitance based on a voltage resulting from passing the mirror current through an impedance. For example, with reference to FIG. 4, the sense voltage 482 is generated from passing mirror current $I_M$ 466 through resistor $R_3$ 467. In one embodiment, such a sense voltage may be compared to a threshold voltage so that an input at the capacitive sensor causes the sense voltage to exceed the threshold voltage.

Alternatively, the measurement circuit can determine the capacitance by using the mirror current to charge an integration capacitor, as described with reference to FIG. 9, as follows.

Figure 9:
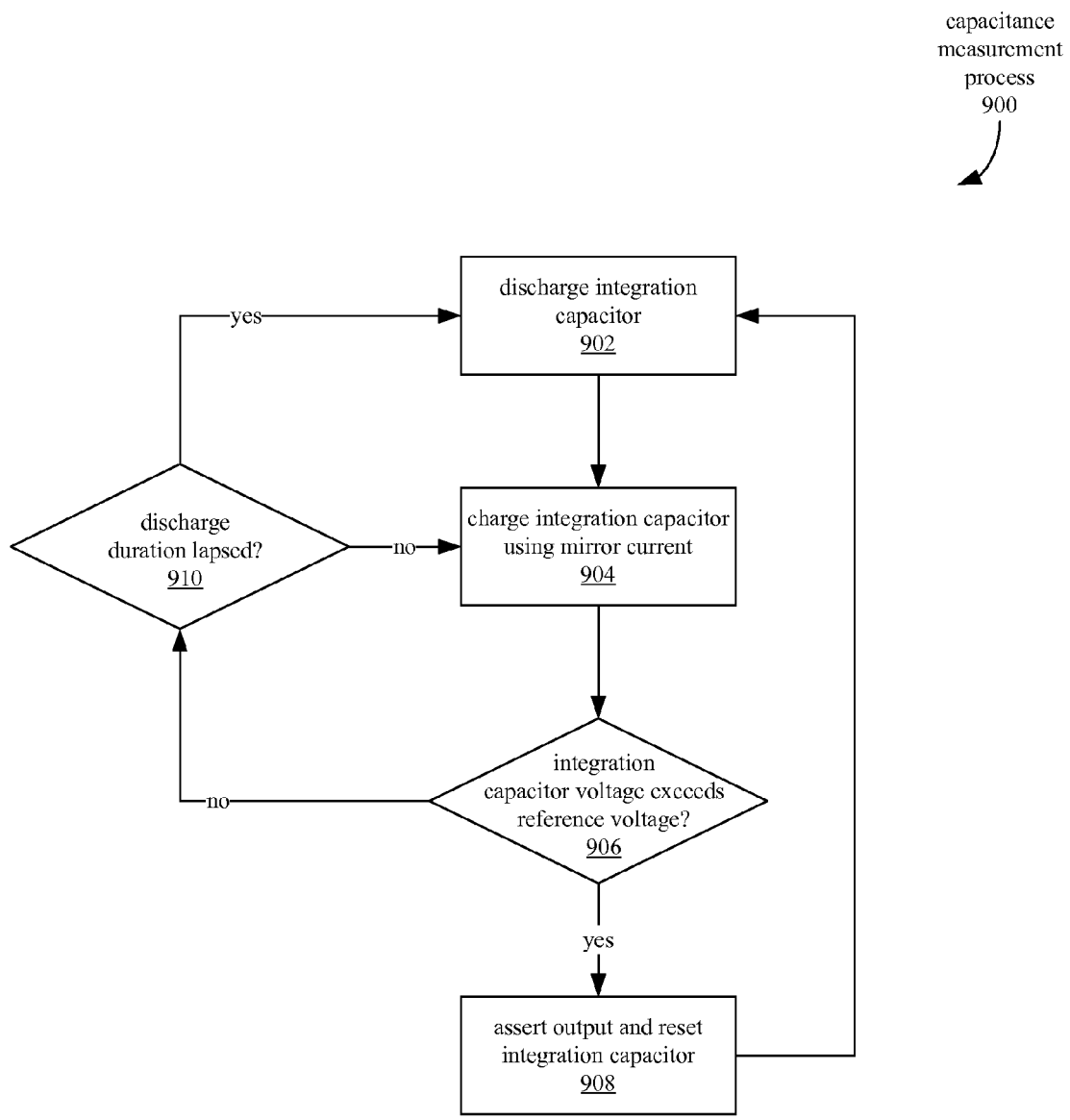
FIG. 9 is a flow diagram illustrating a process using a mirror current for measuring the capacitance of a capacitive sensor, according to one embodiment.

FIG. 9 is a flow diagram illustrating a process for measuring the capacitance of a capacitive sensor using a mirror current to charge an integration capacitor, according to one embodiment. The operations represented by capacitance measurement process 900 correspond to the operations of block 810 of capacitance sensing process 800, which may be implemented, for example, by measurement circuits 280, or 680.

At block 902, the integration capacitor is discharged. For example, in measurement circuit 280, the integration capacitor $C_{INT}$ 282 is discharged by closing the discharge switch 281. The discharge switch 281 is closed in response to comparator 284 asserting its output. Similarly, discharge switch 681 of measurement circuit 680 discharges $C_{INT}$ 657 in response to an asserted output at comparator 682.

At block 904, the integration capacitor is charged using the mirror current. For example, in capacitance sensing circuit 200, the charging of $C_{INT}$ 282 is initiated by opening discharge switch 282 so that mirror current $I_M$ 266 charges $C_{INT}$ 282. In measurement circuit 680, switch 681 is similarly opened to so that $C_{INT}$ 657 is charged by $I_M$ 656.

At block 906, the measurement circuit determines whether the voltage $V_{INT}$ on the integration capacitor $C_{INT}$ exceeds the reference voltage $V_{REF}$. For example, in sensing circuit 200, the voltage $V_{INT}$, across capacitor $C_{INT}$ 282, and $V_{REF}$ 283 are applied to the inputs of comparator 284, which compares the voltages. If $V_{INT}$ exceeds $V_{REF}$ 283, the process 900 continues at block 908.

At block 908, the comparator asserts its output in response to determining that $V_{INT}$ exceeds $V_{REF}$. In the above example, when the voltage $V_{INT}$ across the integration capacitor $C_{INT}$ 282 exceeds $V_{REF}$ 283, the comparator 284 asserts its output. The process 900 continues at block 902, where the assertion of the comparator 284 output causes the discharge of the integration capacitor, as previously described. The discharge of the integration capacitor 282 causes the integration capacitor voltage $V_{INT}$ to drop below $V_{REF}$ 283 so that the comparator 284 deasserts its output. The repeated assertion and subsequent deassertion of the comparator output results in a sequence of pulses.

In one embodiment, a characteristic of the sequence of pulses can be measured to determine the capacitance of the capacitive sensor. For example, the capacitance may be detected using timer 285 in measurement circuit 280. Timer 285 counts a number of oscillations or clock pulses between the pulses output by the comparator 284. In one embodiment, the number of oscillations or clock pulses counted in between comparator pulses corresponds to the capacitance of the sensor.

Alternatively, the sensor capacitance can be determined using a counter, such as counter 685, which counts the number of pulses output by the comparator 682 within a set time period. The number of pulses detected by the counter increases with the capacitance of the capacitive sensor.

If, at block 906, the integration capacitor voltage $V_{INT}$ does not exceed $V_{REF}$, the process 900 continues at block 910. At block 910, the measurement circuit determines whether a discharge duration has lapsed. If the discharge duration has lapsed, the measurement circuit continues at block 902, where the integration capacitor is discharged in response to determining that the discharge duration has lapsed. For example, in measurement circuit 680, the timer 686 may be configured to periodically discharge integration capacitor $C_{INT}$ 657 to ground by closing discharge switch 681. With reference to FIG. 7A, this corresponds to the voltage drop of the integration capacitor voltage 730 at discharge point 734.

In alternative embodiments, the discharge is triggered based on some criteria other than lapse of a time period. Alternatively, the integration capacitor may be discharged only when the comparator output is asserted, and is not independently triggered by the operations represented by block 910.

If, at block 910, the discharge duration has not lapsed, the process 900 continues at block 904, where the measurement circuit continues to charge the integration capacitor from the mirror current.

The embodiments described herein include a capacitance sensing circuit that determines the capacitance of a capacitive sensor based on a mirror current generated by a current mirror, where the mirror current is generated based on a compensated sensor current. The inclusion of the current mirror in such a capacitance sensing circuit, such as capacitance sensing circuit 200, maintains a lower input impedance to increase noise immunity, particularly at low frequencies.

The embodiments described herein may have the advantage of keeping all benefits of switching capacitor methods (especially in the high immunity for RF/EMI noise signals), and may be configured for easy implementation in existing devices from hardware and software perspectives, as well as in future devices.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitance sensing circuit, comprising:
   a capacitive sensor configured to conduct a sensor current;
   a current source coupled with the capacitive sensor, wherein the current source is configured to supply a compensation current to the capacitive sensor;
   a current mirror coupled with the capacitive sensor, wherein the current mirror is configured to generate a mirror current based on a compensated sensor current, and wherein the compensated sensor current represents a difference between the compensation current and the sensor current; and
   a measurement circuit coupled with the current mirror, wherein the measurement circuit is configured to generate an output signal corresponding to a capacitance of the capacitive sensor based on the mirror current and comprises an integration capacitor and a timer configured to detect a rise time for a voltage of the integration capacitor to reach a reference voltage.

2. The capacitance sensing circuit of claim 1, wherein the current source comprises a current digital to analog converter (IDAC).

3. The capacitance sensing circuit of claim 1, further comprising a plurality of switches configured to charge and discharge the capacitive sensor to generate the sensor current.

4. The capacitance sensing circuit of claim 1, wherein the measurement circuit comprises a threshold detector configured to output a signal in response to detecting that an output voltage of the current mirror exceeds a threshold voltage.

5. The capacitance sensing circuit of claim 1, wherein the current mirror amplifies the compensated sensor current.

6. The capacitance sensing circuit of claim 1, wherein the compensation current is approximately equal to an amount of current attributable to a baseline capacitance of the capacitive sensor.

7. The capacitance sensing circuit of claim 1, further comprising a multiplexer bus coupled with the measurement circuit, wherein the multiplexer bus is configured to connect the measurement circuit with any of a plurality of capacitive sensors.

8. A method, comprising:
generating a compensated sensor current based on a difference between a compensation current and sensor current, wherein the sensor current is based on capacitance of a capacitive sensor;
generating a mirror current proportional to the compensated sensor current; and
measuring the mirror current to determine the capacitance of the capacitive sensor, wherein measuring the mirror current comprises:
charging an integration capacitor using the mirror current; and
detecting a rise time for a voltage of the integration capacitor to reach a reference voltage.

9. The method of claim 8, further comprising programming a current digital to analog converter (IDAC) to supply the compensation current.

10. The method of claim 8, further comprising charging and discharging the capacitive sensor to generate the sensor current.

11. The method of claim 8, further comprising outputting a signal in response to detecting than an output voltage of the current mirror exceeds a threshold voltage.

12. The method of claim 8, wherein the mirror current is approximately equal to the compensated sensor current.

13. The method of claim 8, further comprising amplifying the compensated sensor current to generate the mirror current.

14. The method of claim 8, wherein the compensation current is approximately equal to an amount of current attributable to a baseline capacitance of the capacitive sensor.

\* \* \* \* \*